(12) United States Patent  (10) Patent No.: US 8,594,142 B2
Dougakiuchi et al.  (45) Date of Patent: Nov. 26, 2013

(54) WAVELENGTH-TUNABLE LIGHT SOURCE

(75) Inventors: Tatsuo Dougakiuchi, Hamamatsu (JP);
Kazuue Fujita, Hamamatsu (JP);
Tadataka Edamura, Hamamatsu (JP);
Naota Akikusa, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/369,830

(22) Filed: Feb. 9, 2012

(65) Prior Publication Data

US 2012/0219022 A1 Aug. 30, 2012

(30) Foreign Application Priority Data

Feb. 25, 2011 (JP) ................................. 2011-040256

(51) Int. Cl.
*H01S 3/10* (2006.01)
(52) U.S. Cl.
USPC ............... 372/20; 372/75; 372/101; 372/102
(58) Field of Classification Search
USPC ........................................................ 372/20
See application file for complete search history.

(56) References Cited

U.S. PATENT DOCUMENTS

| | | | | | |
|---|---|---|---|---|---|
| 5,323,001 | A | * | 6/1994 | Igaki et al. | 250/231.16 |
| 5,905,571 | A | * | 5/1999 | Butler et al. | 356/328 |
| 6,081,539 | A | * | 6/2000 | Mattori et al. | 372/20 |
| 6,414,930 | B1 | * | 7/2002 | Shiono et al. | 369/112.03 |
| 2002/0003601 | A1 | * | 1/2002 | Wang et al. | 349/202 |
| 2010/0002734 | A1 | * | 1/2010 | Pushkarsky et al. | 372/20 |
| 2010/0002739 | A1 | * | 1/2010 | Hu et al. | 372/45.01 |

FOREIGN PATENT DOCUMENTS

| | | |
|---|---|---|
| EP | 2 081 265 | 7/2009 |
| WO | 2008/036884 | 3/2008 |

* cited by examiner

*Primary Examiner* — Xinning Niu
(74) *Attorney, Agent, or Firm* — Drinker Biddle & Reath LLP

(57) ABSTRACT

A wavelength-tunable light source includes a quantum cascade laser that emits light from a first end and a second end, an optical system that collimates the light emitted from the first end, a first reflecting section on which the light collimated by the optical system is made incident, and a second reflecting section that partially reflects the light emitted from the second end of the quantum cascade laser and transmits the remaining light. The first reflecting section includes a plurality of diffractive gratings whose diffractive properties are different from each other and whose lattice plane directions are variable, and the first reflecting section diffracts a light at a particular wavelength corresponding to the diffractive property and the lattice plane direction of the selected diffractive grating in the direction opposite to the incident direction.

4 Claims, 14 Drawing Sheets

Incident light

WAVELENGTH-TUNABLE LIGHT SOURCE

BACKGROUND OF THE INVENTION

1. Field of the Invention

The present invention relates to a wavelength-tunable light source.

2. Related Background Art

Many molecules display strong absorption in a mid-infrared range (at a wavelength of 2 μm or more), and this wavelength range is known as a fingerprint region. In recent years in particular, the interest in environmental measurement has been increasing, and concentrations of various greenhouse gases have been measured on the basis of absorption in the mid-infrared range. Further, there is a range with a high atmospheric transmittance in a wavelength range of 2 μm to 5 μm, and this wavelength range is called the atmospheric window.

Quantum cascade lasers have been researched and developed as mid-infrared light sources utilizing electronic intersubband transitions, which enables environmental measurement and bioinstrumentation by making use of the feature of the mid-infrared range as described above. The light-emitting properties of general semiconductor lasers are determined by solid state properties of their materials. On the other hand, the light-emitting properties of quantum cascade lasers can be artificially designed and controlled. Accordingly, a quantum cascade laser may be ingeniously designed to be capable of simultaneously emitting light at a plurality of wavelengths, and of having gains in a wide band with a bandwidth ranging several μm (from 2 μm to 20 μm for example) in the mid-infrared range.

Combining such a quantum cascade laser having gains in a wide band with an external resonator may realize a compact wavelength-tunable light source which is capable of performing wavelength tuning in a wide band (see EP Patent Application No. 2081265 and International Publication No. 2008/036884). Using such a single wavelength-tunable light source allows application for a variety of uses.

In a wavelength-tunable light source in which a quantum cascade laser and an external resonator are combined, a light emitted from a first end of the quantum cascade laser is collimated by an optical system to be thereafter made incident on its diffractive grating, and a light at a particular wavelength in the light made incident on the diffractive grating is diffracted in a direction opposite to the incident direction to be returned to the first end of the quantum cascade laser. The light emitted from a second end of the quantum cascade laser is made incident on a reflecting mirror composing the external resonator with the diffractive grating, and the light is partially reflected by the reflecting mirror and the remaining light transmits through the reflecting mirror. The light transmitting through the reflecting mirror is to be an output light from the wavelength-tunable light source. The wavelength of the light returned to the first end of the quantum cascade laser from the diffractive grating (that is, an output light from the wavelength-tunable light source) can be adjusted by adjusting a direction of the lattice plane of the diffractive grating. Such an external resonator is known as one having a Littrow configuration.

SUMMARY OF THE INVENTION

A range of wavelength tuning which can be achieved by a wavelength-tunable light source as described above is a range in which a gain band of its quantum cascade laser and a band in which it is possible to obtain a high diffraction efficiency of its diffractive grating are overlapped, and is limited to a narrower band between the two bands. Under the present circumstances, the bandwidth in which it is possible to obtain a high diffraction efficiency of the diffractive grating is narrower than the gain bandwidth of the quantum cascade laser. Accordingly, a range of wavelength tuning which can be achieved by the wavelength-tunable light source is limited by the diffractive grating.

Further, in a wavelength-tunable light source as described above, in addition to the problem in diffraction efficiency of its diffractive grating, a free spectral range as well may be a great restriction. For example, in consideration of a case where wavelength tuning is performed in a wavelength range of 4 μm to 8 μm, even if there is a diffractive grating with which it is possible to obtain a sufficiently high diffraction efficiency in this range, a primary diffracted light at a wavelength of 8 μm and a secondary diffracted light at a wavelength of 4 μm are emitted in a same direction from the diffractive grating, and therefore, the wavelength-tunable light source oscillates at the two wavelengths. The wider the wavelength range to be tuned is, the more conspicuous the problem becomes.

The present invention has been achieved in order to solve the above-described problems, and it is an object of the present invention to provide a wavelength-tunable light source which is capable of performing wavelength tuning in a wide band and oscillation at a single wavelength.

A wavelength-tunable light source according to one aspect of the present invention includes (1) a quantum cascade laser that emits light from respectively a first end and a second end, (2) an optical system that collimates the light emitted from the first end, (3) a first reflecting section on which the light collimated by the optical system is made incident, the first reflecting section diffracts a light at a particular wavelength in the incident light in a direction opposite to the incident direction, and returns the light at the particular wavelength to the first end, and (4) a second reflecting section that partially reflects the light emitted from the second end and transmits the remaining light, the second reflecting section composes an external resonator with the first reflecting section. Further, in the wavelength-tunable light source according to the aspect of the present invention, the first reflecting section includes a plurality of diffractive gratings whose diffractive properties are different from each other and whose lattice plane directions are variable, and the light collimated by the optical system is made incident on one diffractive grating selected from the plurality of diffractive gratings, and the first reflecting section diffracts a light at a particular wavelength corresponding to the diffractive property and the lattice plane direction of the selected diffractive grating in the direction opposite to the incident direction.

In the wavelength-tunable light source, the first reflecting section may be provided with the plurality of diffractive gratings on one surface of a rotating member which is freely rotatable around a predetermined rotation central axis, and the light collimated by the optical system may be made incident on one diffractive grating selected from the plurality of diffractive gratings according to a rotational position of the rotating member, and a lattice plane direction of the selected diffractive grating may be set according to a rotational position of the rotating member. Alternatively, the first reflecting section may be provided with diffractive gratings on a plurality of the respective side surfaces of a rotating member which is freely rotatable around a predetermined rotation central axis, and the light collimated by the optical system may be made incident on one diffractive grating selected from the plurality of diffractive gratings according to a rotational position of the rotating member, and a lattice plane direction of the selected diffractive grating may be set according to a rotational position of the rotating member. Alternatively, the first reflecting section may be provided with the plurality of diffractive gratings on one surface of a rotating member which is freely rotatable around a predetermined rotation central axis, the light collimated by the optical system may be made incident on one diffractive grating selected from the plurality of diffractive gratings by sliding the plurality of diffractive gratings on the surface of the rotating member, and a lattice plane direction of the selected diffractive grating may be set according to a rotational position of the rotating member.

In the wavelength-tunable light source, the plurality of the respective diffractive gratings may be blazed diffractive gratings whose lattice periods are equal to each other and whose groove depths are different from each other. Further, the optical system may be a parabolic mirror.

DESCRIPTION OF THE PREFERRED EMBODIMENTS

Figure 1:
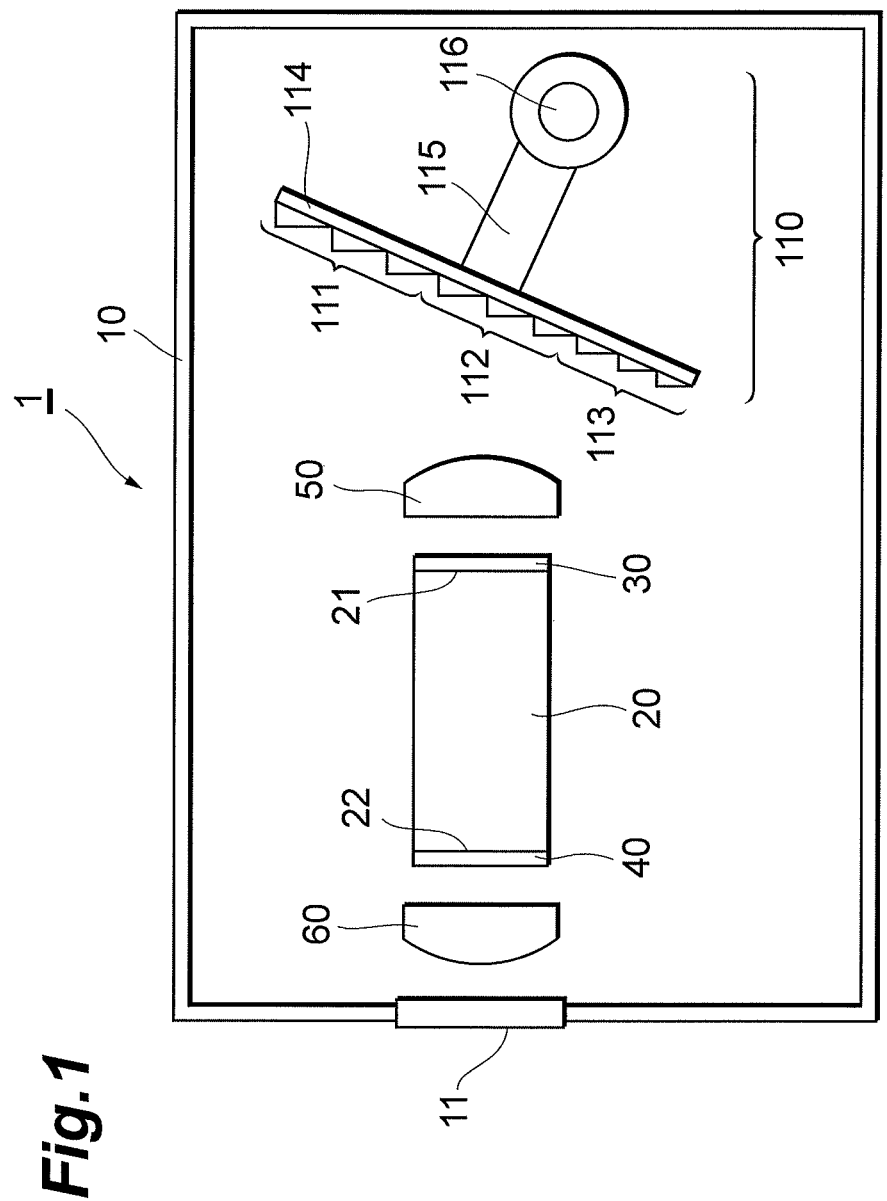
FIG. 1 is a diagram showing a configuration of a wavelength-tunable light source of a first embodiment.

Hereinafter, an embodiment of the present invention will be described in detail with reference to the accompanying drawings. In addition, components which are the same are denoted by the same reference numerals for explanation in the drawings, and overlapping descriptions thereof will be omitted.

First Embodiment

FIG. 1 is a diagram showing a configuration of a wavelength-tunable light source 1 of a first embodiment. The wavelength-tunable light source 1 of the first embodiment includes a case 10, a quantum cascade laser 20, a reflection reducing film 30, a second reflecting section 40, a lens 50, a lens 60, and a first reflecting section 110.

The quantum cascade laser 20 has a first end (edge, facet) 21 and a second end 22 facing each other, and is capable of emitting wideband light in an infrared range from respectively the first end 21 and the second end 22. The quantum cascade laser 20 has a structure in which a plurality of active layers whose central wavelengths are different from each other are laminated in a stack state, that allows the quantum cascade laser 20 to emit wideband light as described above. For example, in order for the quantum cascade laser 20 to emit light in a wavelength range of 4 µm to 12 µm, four types of active layers whose respective central wavelengths are 5 µm, 7 µm, 9 µm, and 11 µm should be laminated in a stack state. Further, the device length of the quantum cascade laser 20 is, for example, 3 mm, and its ridge width is, for example, 12 µm.

The reflection reducing film 30 is provided on the first end 21 of the quantum cascade laser 20. The reflection reducing film 30 reduces reflectance when a light is emitted from the first end 21 of the quantum cascade laser 20 to the outside, to, for example, 5% or less, and reduces reflectance when a light is made incident on the first end 21 of the quantum cascade laser 20 from the outside, to, for example, 5% or less.

The second reflecting section 40 is provided on the second end 22 of the quantum cascade laser 20. The second reflecting section 40 makes reflectance when a light is emitted from the second end 22 of the quantum cascade laser 20 to the outside, become 50% to 90%. The second reflecting section 40 partially reflects the light emitted from the second end 22 of the quantum cascade laser 20 and transmits the remaining light.

The lens 50 collimates the light emitted from the first end 21 of the quantum cascade laser 20. The lens 60 collimates the light emitted from the second end 22 of the quantum cascade laser 20. The lenses 50 and 60 are made of transparent materials at oscillation wavelengths (for example, ZnSe). The lenses 50 and 60 are preferably aspherical lenses in order to reduce spherical aberration. The lenses 50 and 60 are preferably provided with reflection reducing films reducing reflectance to, for example, 5% or less at an oscillation wavelength on their both surfaces. The lenses 50 and 60 have, for example, diameters of 5 mm or less, focal lengths of 1 mm or less, and numerical apertures of 0.9 or more.

A light collimated by the lens 50 is made incident on the first reflecting section 110, and the first reflecting section 110 diffracts a light at a particular wavelength in the incident light in a direction opposite to the incident direction, and returns the light at the particular wavelength to the first end 21 of the quantum cascade laser 20. The first reflecting section 110 and the second reflecting section 40 compose a Littrow-type external resonator. With such a configuration, the optical system can be simplified, which makes it possible to make the device compact and stable.

The case 10 contains the quantum cascade laser 20, the reflection reducing film 30, the second reflecting section 40, the lens 50, the lens 60, and the first reflecting section 110 internally. The case 10 has a window 11 for outputting the light emitted from the second end 22 of the quantum cascade laser 20 and collimated by the lens 60 to the outside. The window 11 is made of a transparent material at an oscillation wavelength (for example, ZnSe), and is preferably provided with reflection reducing films that reduce reflectance to 5% or less at an oscillation wavelength on the both surfaces.

In order to suppress fluctuation in output light wavelength of the quantum cascade laser 20 due to a temperature variation, a temperature regulating mechanism that keeps a temperature of the quantum cascade laser 20 constant is preferably provided in the case 10. Further, in order to enable the quantum cascade laser 20 to be driven at low temperature, it is preferable the inside of the case 10 is hermetically sealed so as to keep a vacuum state or a low-pressure state.

The first reflecting section 110 will be further described in more detail. The first reflecting section 110 includes three diffractive gratings 111 to 113 whose diffractive properties are different from each other and whose lattice plane directions are variable. The diffractive gratings 111 to 113 are provided on one surface of a rotating member 114, which is freely rotatable via an arm 115 around a predetermined rotation central axis 116. The light collimated by the lens 50 is made incident on one diffractive grating selected from the diffractive gratings 111 to 113 according to a rotational position of the rotating member 114, and a lattice plane direction of the selected diffractive grating is set according to a rotational position of the rotating member 114. Then, the first reflecting section 110 is capable of diffracting a light at a particular wavelength corresponding to the diffractive property and the lattice plane direction of the selected diffractive grating in the direction opposite to the incident direction, and returns the light at the particular wavelength to the first end 21 of the quantum cascade laser 20.

Figure 2:
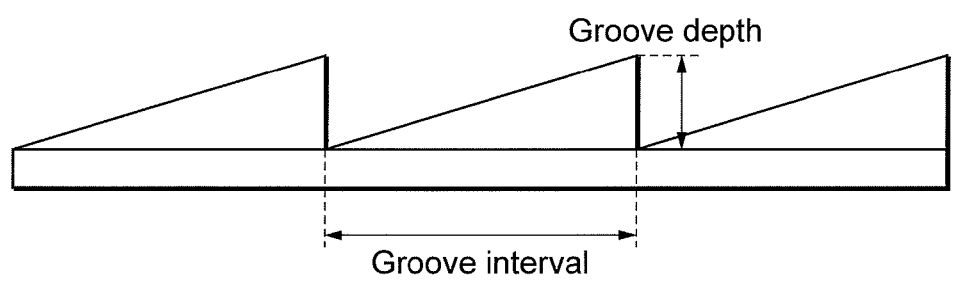
FIG. 2 is a diagram for explanation of a cross-sectional shape of each lattice of a blazed diffractive grating.

The diffractive gratings 111 to 113 are, as shown in FIG. 2, preferably blazed diffractive gratings in which the cross section of each lattice is a saw-tooth shape. The diffractive gratings 111 to 113 may be formed such that their lattice periods (groove intervals) are equal to each other and their groove depths are different from each other. For example, it is assumed that each groove density of the diffractive gratings 111 to 113 is 120 grooves per mm, a usable wavelength range of the diffractive grating 111 is 4 μm to 7 μm, a usable wavelength range of the diffractive grating 112 is 7 μm to 10 μm, and a usable wavelength range of the diffractive grating 113 is 10 μm to 12 μm. When a groove density d is determined, a diffraction angle α with respect to a wavelength λ of a light to be returned is uniquely determined by the following formula (1). Because of the Littrow configuration, a diffraction order m is set to 1.

$$m\lambda = 2d \cdot \sin \alpha \quad (1)$$

Figure 3:
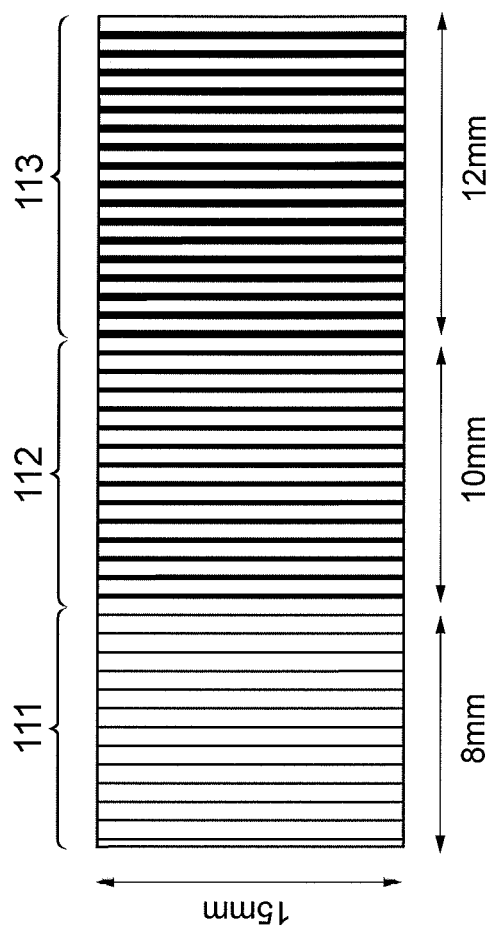
FIG. 3 is a diagram for explanation of configurations and sizes of diffractive gratings.

As is clear from the formula, the longer the wavelength λ is, the larger the diffraction angle α is. Accordingly, the diffractive gratings 111 to 113 are arrayed so as to perform wavelength tuning on the long-wavelength side in a range at a large diffraction angle, and to perform wavelength tuning on the short-wavelength side in a range at a small diffraction angle. However, the larger the incident angle θ of a light onto the diffractive grating is, the longer the travel distance of a light spot per unit angle is. Therefore, the diffractive grating 113 for a long-wavelength which is used in a range at a large incident angle θ preferably has an area larger than those of the other diffractive gratings 111 and 112. Accordingly, as shown in FIG. 3, for example, the width of the diffractive grating 111 should be set to 8 mm, the width of the diffractive grating 112 should be set to 10 mm, and width of the diffractive grating 113 should be set to 12 mm.

Figure 4:
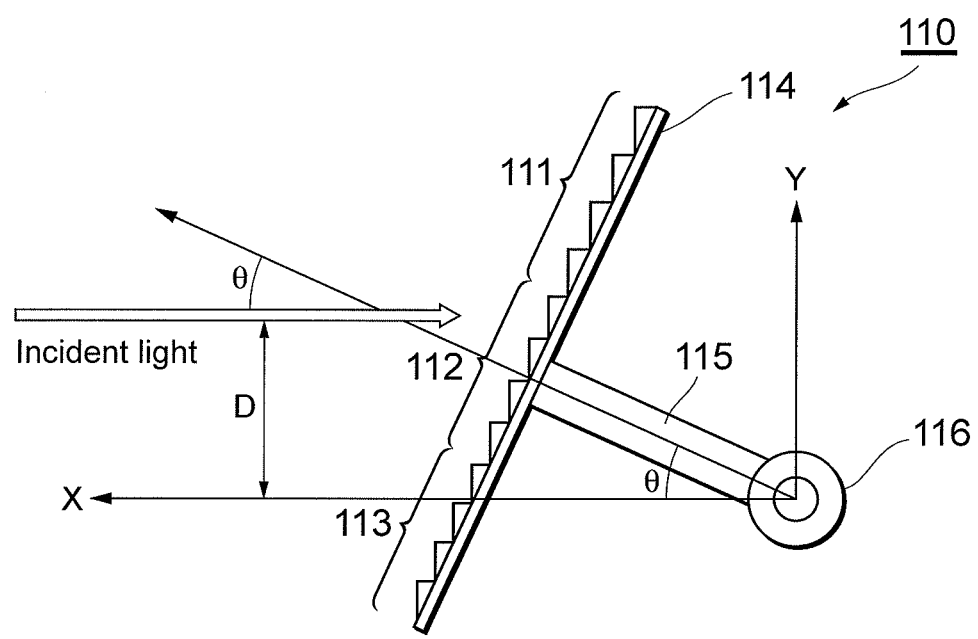
FIG. 4 is a diagram showing a detailed configuration of a first reflecting section of the wavelength-tunable light source of the first embodiment.

FIG. 4 is a diagram showing a detailed configuration of the first reflecting section 110 of the wavelength-tunable light source 1 of the first embodiment. The rotation central axis 116 is spaced by a distance D=25 mm from a principal ray of the light which is collimated by the lens to be made incident on the first reflecting section 110. The diffractive gratings 111 to 113 are spaced by 50 mm from the rotation central axis 116 due to the arm 115, and are freely rotatable around the rotation central axis 116. In this case, when the rotation angle θ of the arm (that is, the incident angle θ of light onto the diffractive grating=the diffraction angle α) is changed from 10 degrees to 40 degrees, the light incident position on the lattice plane of the diffractive grating can be moved within 25 mm.

Then, the saw-tooth shape of the diffractive grating 111 is determined so as to increase a diffraction efficiency within the incident angle θ of 10 degrees to 20 degrees and within the wavelength λ of 4 μm to 7 μm. The saw-tooth shape of the diffractive grating 112 is determined so as to increase a diffraction efficiency within the incident angle θ of 20 degrees to 30 degrees and within the wavelength λ of 7 μm to 10 μm. The saw-tooth shape of the diffractive grating 113 is determined so as to increase a diffraction efficiency within the incident angle θ of 30 degrees to 40 degrees and within the wavelength λ of 10 μm to 12 μm.

At the time of determining the saw-tooth shapes of the diffractive gratings 111 to 113, their lattice periods (groove intervals) may be set to respective values. However, the lattice periods (groove intervals) may be the same, and their groove depths may be set to the respective values. In the case of the Littrow configuration, a groove depth is expressed by the following formula (2) with respect to a wavelength λ of a light to be returned and its incident angle θ. By selecting a groove depth satisfying the formula (2), the diffraction efficiency is maximized.

$$\text{Groove depth} = \lambda / (2 \cos \theta) \quad (2)$$

Figure 5:
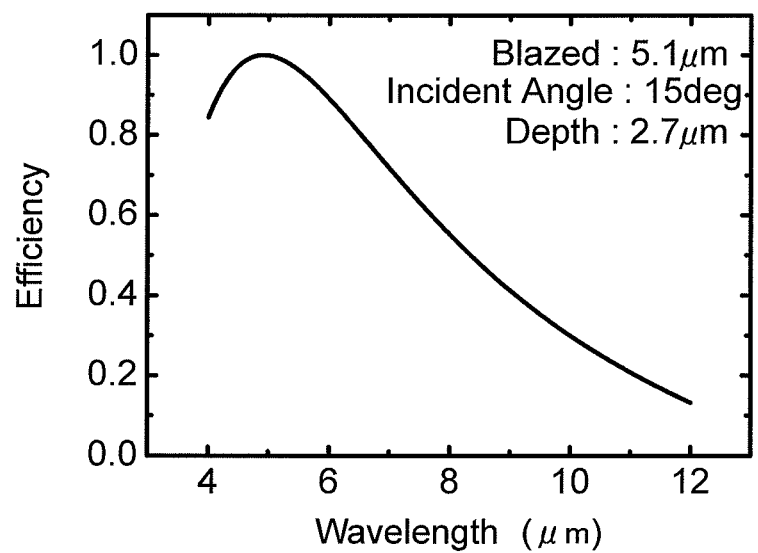
FIG. 5 is a graph showing wavelength dependence of a diffraction efficiency when a light is made incident on the diffractive grating at an incident angle of 15 degrees in the wavelength-tunable light source of the first embodiment.

In the diffractive grating 111, given that 15 degrees that is the center value of the incident angle range to be used is an incident angle θ, and a blazed wavelength is 5.1 μm, a groove depth satisfying the formula (2) is to be 2.7 μm. With these values to be adopted, substantially the same diffraction efficiency is obtained at the both ends of the wavelength range of 4 μm to 7 μm, which is assigned to the diffractive grating 111, that brings a high diffraction efficiency in this wavelength range. FIG. 5 is a graph showing wavelength dependence of a diffraction efficiency when a light is made incident on the diffractive grating 111 at an incident angle of 15 degrees in the wavelength-tunable light source 1 of the first embodiment. As shown in this graph, the diffraction efficiency becomes 0.7 or more in the wavelength range of 4 μm to 7 μm.

Figure 6:
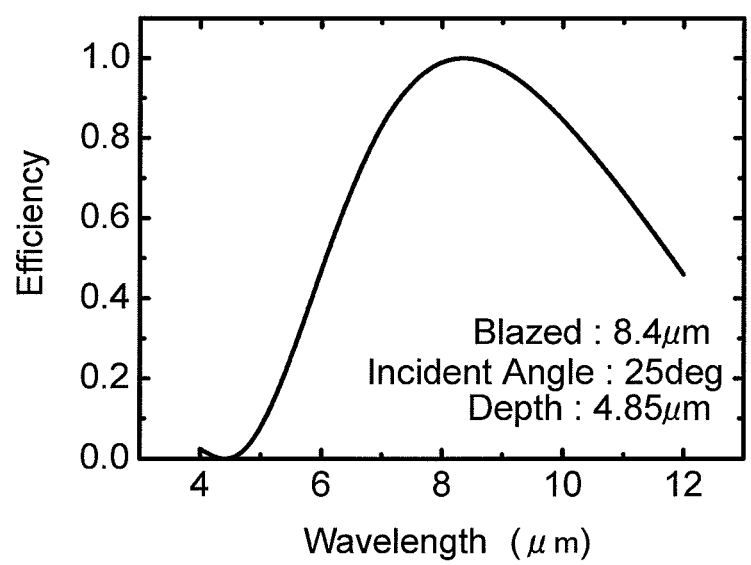
FIG. 6 is a graph showing wavelength dependence of a diffraction efficiency when a light is made incident on the diffractive grating at an incident angle of 25 degrees in the wavelength-tunable light source of the first embodiment.

In the diffractive grating 112, given that 25 degrees that is the center value of the incident angle range to be used is an incident angle θ, and a blazed wavelength is 8.4 μm, a groove depth satisfying the formula (2) is to be 4.85 μm. With these values to be adopted, substantially the same diffraction efficiency is obtained at the both ends of the wavelength range of 7 μm to 10 μm, which is assigned to the diffractive grating 112, that brings a high diffraction efficiency in this wavelength range. FIG. 6 is a graph showing wavelength dependence of a diffraction efficiency when a light is made incident on the diffractive grating 112 at an incident angle of 25 degrees in the wavelength-tunable light source 1 of the first embodiment. As shown in this graph, the diffraction efficiency becomes 0.8 or more in the wavelength range of 7 μm to 10 μm.

Figure 7:
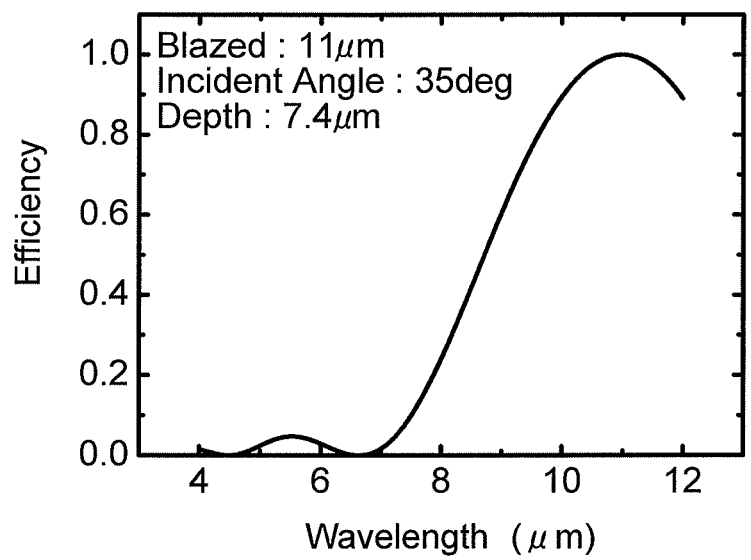
FIG. 7 is a graph showing wavelength dependence of a diffraction efficiency when a light is made incident on the diffractive grating at an incident angle of 35 degrees in the wavelength-tunable light source of the first embodiment.

In the diffractive grating 113, given that 35 degrees that is the center value of the incident angle range to be used is an incident angle θ, and a blazed wavelength is 11 μm, a groove depth satisfying the formula (2) is to be 7.4 μm. With these values to be adopted, substantially the same diffraction efficiency is obtained at the both ends of the wavelength range of 10 μm to 12 μm, which is assigned to the diffractive grating 113, that brings a high diffraction efficiency in this wavelength range. FIG. 7 is a graph showing wavelength dependence of a diffraction efficiency when a light is made incident on the diffractive grating 113 at an incident angle of 35 degrees in the wavelength-tunable light source 1 of the first embodiment. As shown in this graph, the diffraction efficiency becomes 0.9 or more in the wavelength range of 10 μm to 12 μm.

As shown in FIGS. 5 to 7, each of the diffractive gratings 111 to 113 is designed so as to obtain a high diffraction efficiency with respect to its assigning wavelength band. On the other hand, each of the diffractive gratings 111 to 113 has a sufficiently low diffraction efficiency with respect to a wavelength band other than its assigning wavelength band, thereby it is possible to be free from the effect of a secondary diffracted light. For example, it is understood from FIG. 7 that, when 10 μm is selected as a wavelength to be returned, since an efficiency of secondary diffraction with respect to a light at a wavelength of 5 μm is extremely low, this suppresses the effect by a secondary diffracted light brought from the light at a wavelength of 5 μm.

In addition, the diffractive gratings 111 to 113 are preferably coated with gold on their reflecting surfaces in order to enhance its reflection efficiency. A motor may be used for adjusting the lattice plane directions of the diffractive gratings 111 to 113 by rotating the diffractive gratings 111 to 113 around the rotation central axis 116, and its rotational position is preferably automatically controlled according to a desired oscillation wavelength λ. In addition to the size example of the respective components in the above description, provided that a distance between the lens 50 and the first reflecting section 111 is set to approximately 20 mm, the case 10 can be formed in a size of approximately 100 mm in length×80 mm in width×70 mm in height. Such downsizing of the device is possible by using a single rotational mechanism to select a diffractive grating and set its lattice plane direction.

In the first embodiment, the first reflecting section 110 composing the external resonator along with the second reflecting section 40 includes the diffractive gratings 111 to 113 whose diffractive properties are different from each other and whose lattice plane directions are variable, and the light collimated by the lens 50 is made incident on one diffractive grating selected from among the diffractive gratings 111 to 113, and the first reflecting section 110 diffracts a light at a particular wavelength corresponding to the diffractive property and the lattice plane direction of the selected diffractive grating in the direction opposite to the incident direction, and returns the light at the particular wavelength to the first end 21 of the quantum cascade laser 20. With such a configuration, the wavelength-tunable light source 1 of the first embodiment is capable of performing wavelength tuning in a wide band, and performing oscillation at a single wavelength.

As a configuration of the first reflecting section composing the external resonator with the second reflecting section 40, in addition to the configuration of the first reflecting section 110 of the first embodiment, various modes are possible. Other configurations of the first reflecting section, which may be adopted in place of the first reflecting section 110 in the wavelength-tunable light source shown in FIG. 1, will be described in the following second to sixth embodiments.

Second Embodiment

Figure 8:
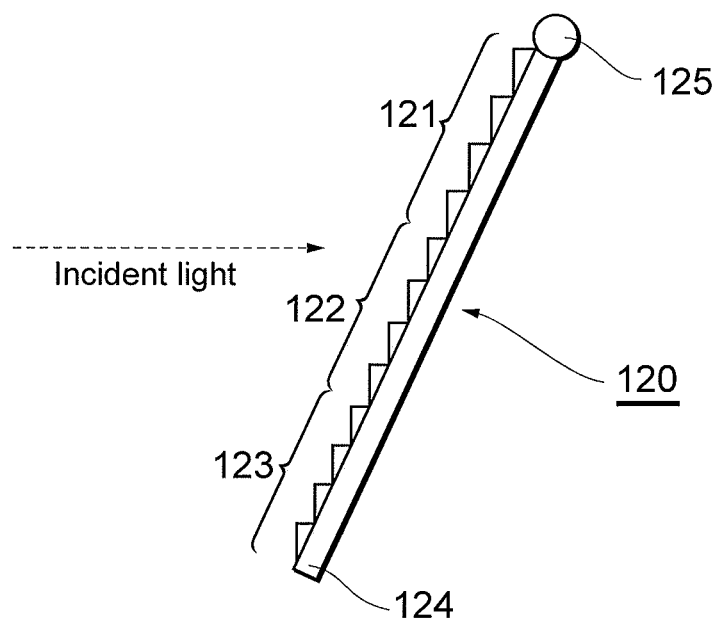
FIG. 8 is a diagram showing a configuration of a first reflecting section of a wavelength-tunable light source of a second embodiment.

FIG. 8 is a diagram showing a configuration of a first reflecting section 120 of a wavelength-tunable light source of a second embodiment. In the first reflecting section 110 of the first embodiment, the diffractive gratings 111 to 113 are provided on the surface of the rotating member 114 connected to the rotation central axis 116 via the arm 115. On the other hand, in the first reflecting section 120 of the second embodiment, diffractive gratings 121 to 123 are provided on a surface of a rotating member 124 directly connected to a rotation central axis 125.

The diffractive gratings 121 to 123 are provided on the one surface of the rotating member 124, which is freely rotatable around the rotation central axis 125. The diffractive gratings 121 to 123 of the second embodiment are designed in the same way as the diffractive gratings 111 to 113 of the first embodiment. The rotation central axis 125 is spaced by a certain distance from a principal ray of a light which is collimated by the lens 50 to be made incident on the first reflecting section 120.

The light collimated by the lens 50 is made incident on one diffractive grating selected from the diffractive gratings 121 to 123 according to a rotational position of the rotating member 124, and a lattice plane direction of the selected diffractive grating is set according to a rotational position of the rotating member 124. Then, the first reflecting section 120 is capable of diffracting a light at a particular wavelength corresponding to the diffractive property and the lattice plane direction of the selected diffractive grating in a direction opposite to the incident direction, and returns the light at the particular wavelength to the first end 21 of the quantum cascade laser 20.

In the same way as the wavelength-tunable light source 1 of the first embodiment, the wavelength-tunable light source of the second embodiment as well uses the single rotational mechanism to select a diffractive grating and set its lattice plane direction, that allows downsizing thereof. Further, the wavelength-tunable light source of the second embodiment as well is capable of performing wavelength tuning in a wide band, and performing oscillation at a single wavelength.

Third Embodiment

Figure 9:
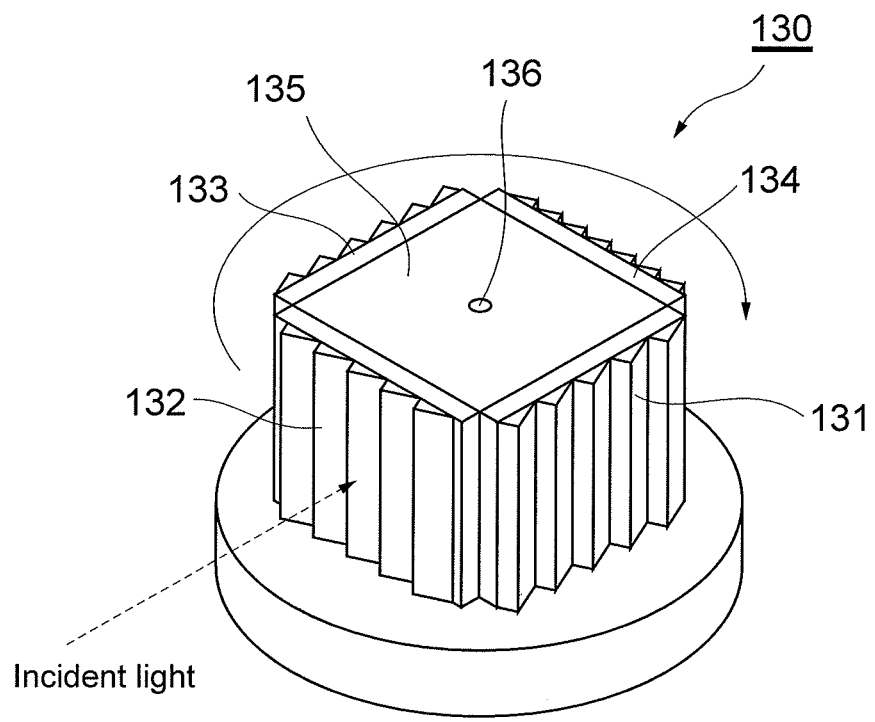
FIG. 9 is a diagram showing a configuration of a first reflecting section of a wavelength-tunable light source of a third embodiment.

FIG. 9 is a diagram showing a configuration of a first reflecting section 130 of a wavelength-tunable light source of a third embodiment. In the first reflecting section 130 of the third embodiment, four diffractive gratings 131 to 134 are provided on the four respective side surfaces of a quadrangular prismatic shaped rotating member 135, which is freely rotatable around a rotation central axis 136. The diffractive gratings 131 to 134 of the third embodiment may be designed such that their groove intervals are uniform in the same way as the diffractive gratings 111 to 113 of the first embodiment, or may be designed such that the groove intervals are different from each other.

The light collimated by the lens 50 is made incident on one diffractive grating selected from the four diffractive gratings 131 to 134 according to a rotational position of the rotating member 135, and a lattice plane direction of the selected diffractive grating is set according to a rotational position of the rotating member 135. Then, the first reflecting section 130 is capable of diffracting a light at a particular wavelength corresponding to the diffractive property and the lattice plane direction of the selected diffractive grating in a direction opposite to the incident direction, and returns the light at the particular wavelength to the first end 21 of the quantum cascade laser 20.

In the same way as the wavelength-tunable light source 1 of the first embodiment, the wavelength-tunable light source of the third embodiment as well uses the single rotational mechanism to select a diffractive grating and set its lattice plane direction, that allows downsizing thereof. Further, the wavelength-tunable light source of the third embodiment as well is capable of performing wavelength tuning in a wide band, and performing oscillation at a single wavelength.

In addition, the rotating member 135 is not limited to a quadrangular prismatic shape, and may be generally a polygonal pillar shape. In the case where the rotating member 135 is a hexagonal columnar shape, it is possible to provide six diffractive gratings thereon.

Fourth Embodiment

Figure 10:
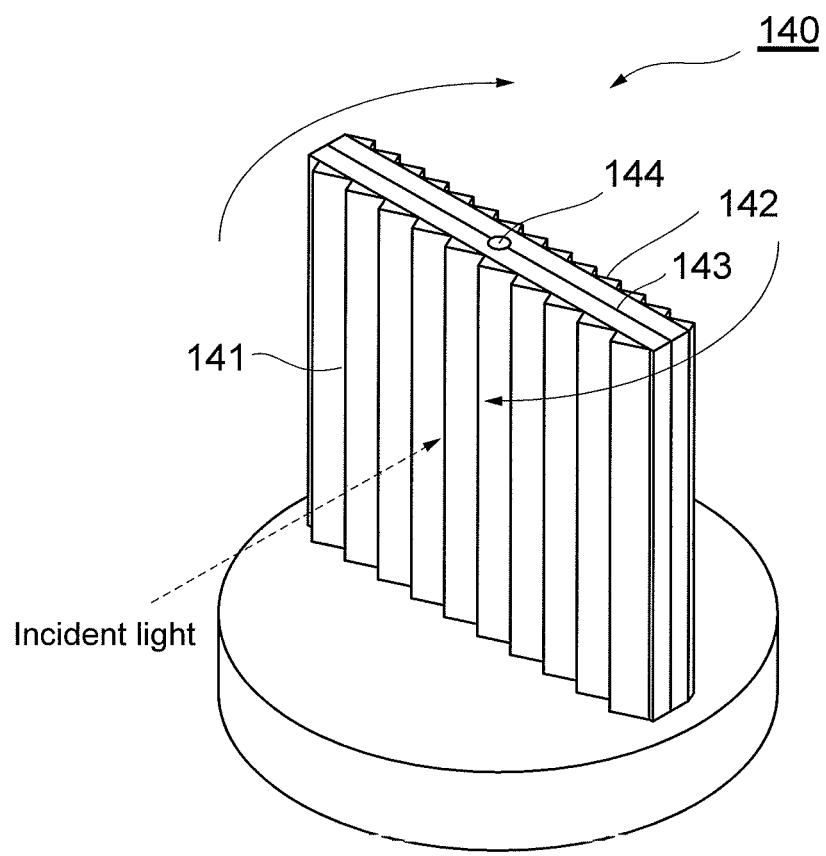
FIG. 10 is a diagram showing a configuration of a first reflecting section of a wavelength-tunable light source of a fourth embodiment.

FIG. 10 is a diagram showing a configuration of a first reflecting section 140 of a wavelength-tunable light source of a fourth embodiment. In the first reflecting section 140 of the fourth embodiment, two diffractive gratings 141 and 142 are provided on the two respective surfaces of a plane plate-like rotating member 143, which is freely rotatable around a rotation central axis 144. The diffractive gratings 141 and 142 of the fourth embodiment may be designed such that their groove intervals are uniform in the same way as the diffractive gratings 111 to 113 of the first embodiment, or may be designed such that the groove intervals are different from each other.

The light collimated by the lens 50 is made incident on one diffractive grating selected from the two diffractive gratings 141 and 142 according to a rotational position of the rotating member 143, and a lattice plane direction of the selected diffractive grating is set according to a rotational position of the rotating member 143. Then, the first reflecting section 140 is capable of diffracting a light at a particular wavelength corresponding to the diffractive property and the lattice plane direction of the selected diffractive grating in a direction opposite to the incident direction, and returns the light at the particular wavelength to the first end 21 of the quantum cascade laser 20.

In the same way as the wavelength-tunable light source 1 of the first embodiment, the wavelength-tunable light source of the fourth embodiment as well uses the single rotational mechanism to select a diffractive grating and set its lattice plane direction, that allows downsizing thereof. Further, the wavelength-tunable light source of the fourth embodiment as well is capable of performing wavelength tuning in a wide band, and performing oscillation at a single wavelength. In the present embodiment, it is possible to uniform the resonator length (or reduce the variation of the resonator length) independently of a rotational position of the rotating member.

Fifth Embodiment

Figure 11:
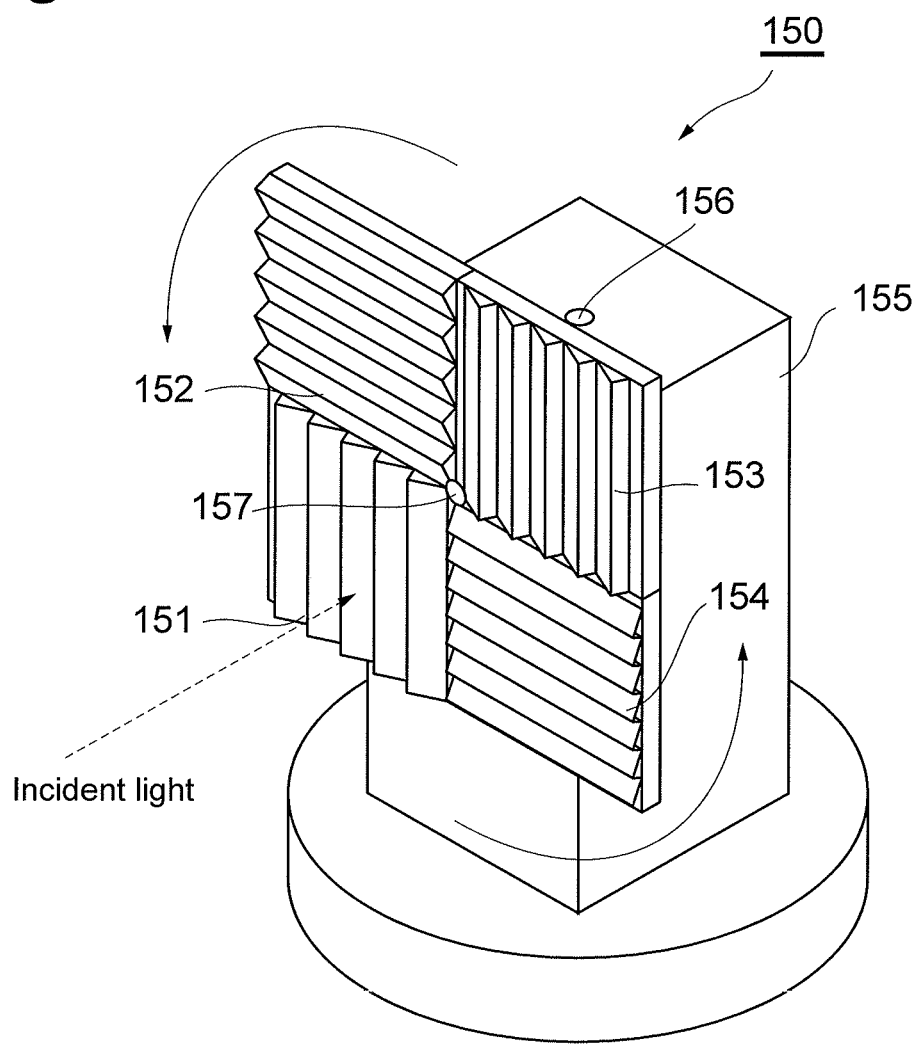
FIG. 11 is a diagram showing a configuration of a first reflecting section of a wavelength-tunable light source of a fifth embodiment.

FIG. 11 is a diagram showing a configuration of a first reflecting section 150 of a wavelength-tunable light source of a fifth embodiment. In the first reflecting section 150 of the wavelength-tunable light source of the fifth embodiment, four diffractive gratings 151 to 154 are provided on one surface of a rotating member 155, which is freely rotatable around a rotation central axis 156, and are capable of rotationally moving around a center point 157 to slide on the surface of the rotating member 155. The diffractive gratings 151 to 154 of the fifth embodiment may be designed such that their groove intervals are uniform in the same way as the diffractive gratings 111 to 113 of the first embodiment, or may be designed such that the groove intervals are different from each other.

When the diffractive gratings 151 to 154 rotationally move around the center point 157 to slide on the surface of the rotating member 155, the light collimated by the lens 50 is made incident on one diffractive grating selected from the four diffractive gratings 151 to 154. Further, the lattice plane direction of the selected diffractive grating is set according to a rotational position of the rotating member 155. Then, the first reflecting section 150 is capable of diffracting a light at a particular wavelength corresponding to the diffractive property and the lattice plane direction of the selected diffractive grating in a direction opposite to the incident direction, and returns the light at the particular wavelength to the first end 21 of the quantum cascade laser 20.

In the same way as the wavelength-tunable light source 1 of the first embodiment, the wavelength-tunable light source of the fifth embodiment as well is capable of performing wavelength tuning in a wide band, and performing oscillation at a single wavelength. In the present embodiment, it is possible to uniform the resonator length (or reduce the variation of the resonator length) independently of a rotational position of the rotating member. Further, in the present embodiment, it is possible to easily increase the number of diffractive gratings.

Sixth Embodiment

Figure 12:
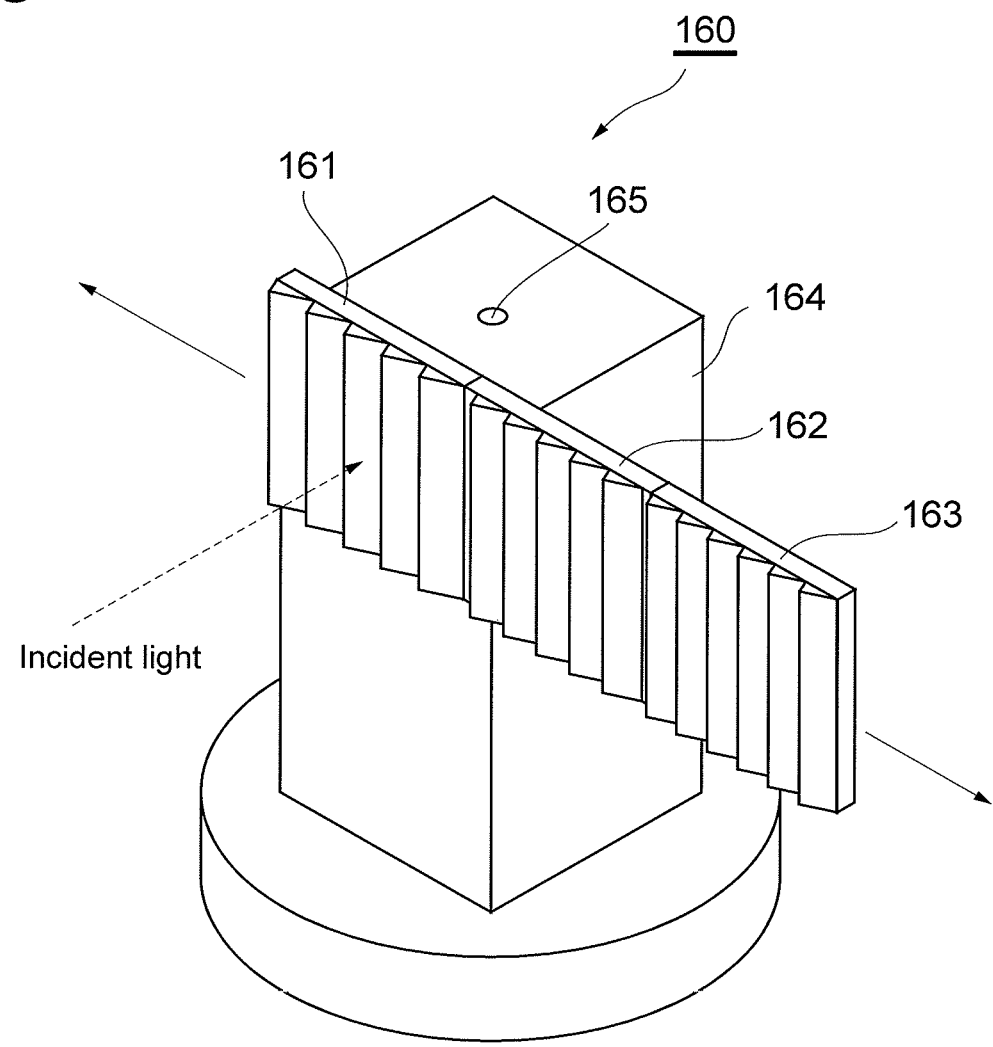
FIG. 12 is a diagram showing a configuration of a first reflecting section of a wavelength-tunable light source of a sixth embodiment.

FIG. 12 is a diagram showing a configuration of a first reflecting section 160 of a wavelength-tunable light source of a sixth embodiment. In the first reflecting section 160 of the wavelength-tunable light source of the sixth embodiment, three diffractive gratings 161 to 163 are provided on one surface of a rotating member 164, which is freely rotatable around a rotation central axis 165, and are capable of moving in parallel to slide on the surface of the rotating member 164. The diffractive gratings 161 to 163 of the sixth embodiment may be designed such that their groove intervals are uniform in the same way as the diffractive gratings 111 to 113 of the first embodiment, or may be designed such that the groove intervals are different from each other.

When the diffractive gratings 161 to 163 move in parallel to slide on the surface of the rotating member 164, the light collimated by the lens 50 is made incident on one diffractive grating selected from the three diffractive gratings 161 to 163. Further, the lattice plane direction of the selected diffractive grating is set according to a rotational position of the rotating member 164. Then, the first reflecting section 160 is capable of diffracting a light at a particular wavelength corresponding to the diffractive property and the lattice plane direction of the selected diffractive grating in a direction opposite to the incident direction, and returns the light at the particular wavelength to the first end 21 of the quantum cascade laser 20.

In the same way as the wavelength-tunable light source 1 of the first embodiment, the wavelength-tunable light source of the sixth embodiment as well is capable of performing wavelength tuning in a wide band, and performing oscillation at a single wavelength. In the present embodiment, it is possible to uniform the resonator length (or reduce the variation of the resonator length) independently of a rotational position of the rotating member. Further, in the present embodiment, it is possible to randomly increase the number of diffractive gratings.

Seventh Embodiment

In the first to sixth embodiments described above, the lenses 50 and 60 are used as an optical system to collimate light emitted from the quantum cascade laser 20. On the other hand, in a seventh embodiment, parabolic mirrors 70 and 80 are used as an optical system to collimate light emitted from the quantum cascade laser 20.

Figure 13:
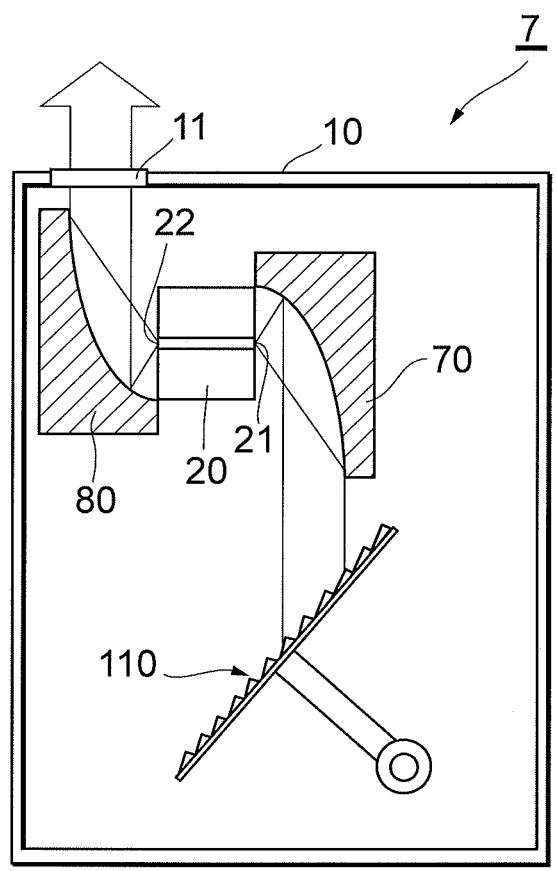
FIG. 13 is a diagram showing a configuration of a wavelength-tunable light source of a seventh embodiment.

FIG. 13 is a diagram showing a configuration of a wavelength-tunable light source 7 of the seventh embodiment. The wavelength-tunable light source 7 of the seventh embodiment includes the case 10, the quantum cascade laser 20, the reflection reducing film 30, the second reflecting section 40, the parabolic mirror 70, the parabolic mirror 80, and the first reflecting section 110. In comparison with the configuration of the wavelength-tunable light source 1 of the first embodiment shown in FIG. 1, the wavelength-tunable light source 7 of the seventh embodiment shown in FIG. 13 is different in the point that the parabolic mirror 70 is included in place of the lens 50, and in the point that the parabolic mirror 80 is included in place of the lens 60.

The parabolic mirror 70 collimates the light emitted from the first end 21 of the quantum cascade laser 20. The parabolic mirror 80 collimates the light emitted from the second end 22 of the quantum cascade laser 20. In general, lenses differ in focal length according to a wavelength due to its color aberration. On the other hand, parabolic mirrors are uniform in focal length independently of a wavelength. Accordingly, parabolic mirrors are preferably used rather than lenses as an optical system to collimate light in a wide band as in the present embodiment.

Figure 14:
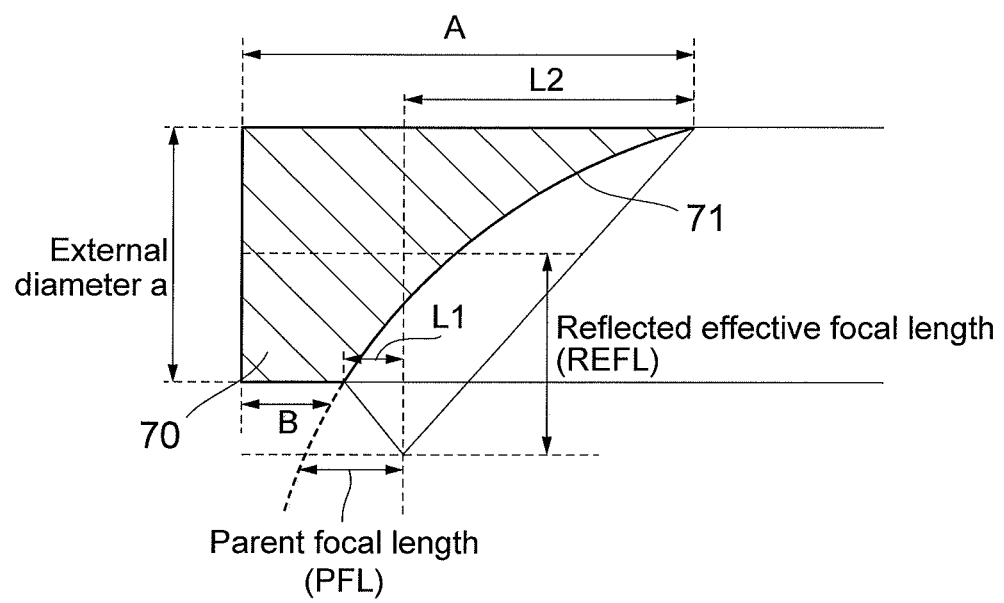
FIG. 14 is a diagram for explanation of a detailed configuration of a parabolic mirror.

FIG. 14 is a diagram for explanation of a detailed configuration of the parabolic mirror 70. A paraboloidal surface 71 is designed so as to deflect a collimated light in a direction from 60 degrees to 90 degrees. From the viewpoint that a position of a light spot is moved on the diffractive grating of the first reflecting section 110, it is recommended that the light emitted from the quantum cascade laser 20 is deflected in the direction of 90 degrees, to narrow the flux of light so as to make the light spot smaller. Further, in the same way, it is preferable that its external diameter a is approximately 5 mm in order to make a light spot on the diffractive gratings of the first reflecting section 110 smaller.

Since the light emitted from the quantum cascade laser 20 radiates so as to spread at substantially 60 degrees on one side, it is important to collimate the emitted light by the parabolic mirror 70 before the light broadly scatters. Accordingly, it is better to make an reflected effective focal length REFL as short as possible. In association therewith, L1, L2, and PFL in the same drawing are set to appropriate sizes so as to be able to receive the whole emitted light having the spread at 60 degrees on one side.

In the same way as the wavelength-tunable light source 1 of the first embodiment, the wavelength-tunable light source 7 of the seventh embodiment as well uses the single rotational mechanism to select a diffractive grating and set its lattice plane direction, that allows downsizing thereof. Further, the wavelength-tunable light source 7 of the seventh embodiment as well is capable of performing wavelength tuning in a wide band, and performing oscillation at a single wavelength. Further, the wavelength-tunable light source 7 of the seventh embodiment uses the parabolic mirrors as an optical system to collimate light emitted from the quantum cascade laser 20, so that the wavelength-tunable light source 7 is capable of performing high-efficiency laser oscillation in a wide band.

In addition, in place of the first reflecting section 110, any one of the first reflecting sections 120, 130, 140, 150, and 160 may be used.

The wavelength-tunable light source of the present invention is capable of performing wavelength tuning in a wide band, and performing oscillation at a single wavelength.

What is claimed is:

1. A wavelength-tunable light source comprising:
a quantum cascade laser that emits light from respectively a first end and a second end;
an optical system that collimates the light emitted from the first end;
a first reflecting section on which the light collimated by the optical system is made incident, the first reflecting section diffracts a light at a particular wavelength in the incident light in a direction opposite to the incident direction, and returns the light at the particular wavelength to the first end; and
a second reflecting section that partially reflects the light emitted from the second end and transmits the remaining light, the second reflecting section composes an external resonator with the first reflecting section,
wherein the first reflecting section includes a plurality of diffractive gratings whose diffractive properties are different from each other and whose lattice plane directions are variable, and the light collimated by the optical system is made incident on one diffractive grating selected from the plurality of diffractive gratings, and the first reflecting section diffracts a light at a particular wavelength corresponding to the diffractive property and the lattice plane direction of the selected diffractive grating in the direction opposite to the incident direction,
wherein the plurality of the respective diffractive gratings are blazed diffractive gratings whose lattice periods are equal to each other and whose groove depths are different from each other,
wherein the first reflecting section is provided with diffractive gratings on a plurality of the respective side surfaces of a polygonal pillar shaped rotating member which is freely rotatable around a predetermined rotation central axis, and
wherein the light collimated by the optical system is made incident on one diffractive grating selected from the plurality of diffractive gratings according to a rotational position of the rotating member, and a lattice plane direction of the selected diffractive grating is set according to a rotational position of the rotating member.

2. The wavelength-tunable light source according to claim 1, wherein the optical system is a parabolic mirror.

3. A wavelength-tunable light source comprising:
a quantum cascade laser that emits light from respectively a first end and a second end;
an optical system that collimates the light emitted from the first end;
a first reflecting section on which the light collimated by the optical system is made incident, the first reflecting section diffracts a light at a particular wavelength in the incident light in a direction opposite to the incident direction, and returns the light at the particular wavelength to the first end; and
a second reflecting section that partially reflects the light emitted from the second end and transmits the remaining light, the second reflecting section composes an external resonator with the first reflecting section,
wherein the first reflecting section includes a plurality of diffractive gratings whose diffractive properties are different from each other and whose lattice plane directions are variable, and the light collimated by the optical system is made incident on one diffractive grating selected from the plurality of diffractive gratings, and the first reflecting section diffracts a light at a particular wavelength corresponding to the diffractive property and the lattice plane direction of the selected diffractive grating in the direction opposite to the incident direction,
wherein the plurality of the respective diffractive gratings are blazed diffractive gratings whose lattice periods are equal to each other and whose groove depths are different from each other, wherein the first reflecting section is provided with the plurality of diffractive gratings on one surface of a rotating member which is freely rotatable around a predetermined rotation central axis, wherein the light collimated by the optical system is made incident on one diffractive grating selected from the plurality of diffractive gratings by sliding the plurality of diffractive gratings in a direction different from an optical axis direction of incident light, and wherein a lattice plane direction of the selected diffractive grating is set according to a rotational position of the rotating member.

4. The wavelength-tunable light source according to claim 3, wherein the optical system is a parabolic mirror.

* * * * *